US009893138B2

(12) United States Patent
Lee

(10) Patent No.: US 9,893,138 B2
(45) Date of Patent: Feb. 13, 2018

(54) DISPLAY PANEL

(71) Applicant: RITDISPLAY CORPORATION, Hsinchu (TW)

(72) Inventor: Chih-Yen Lee, Hsinchu County (TW)

(73) Assignee: RITDISPLAY CORPORATION, Hsinchu (TW)

( * ) Notice: Subject to any disclaimer, the term of this patent is extended or adjusted under 35 U.S.C. 154(b) by 0 days.

(21) Appl. No.: 15/390,839

(22) Filed: Dec. 27, 2016

(65) Prior Publication Data

US 2017/0301744 A1 Oct. 19, 2017

(30) Foreign Application Priority Data

Apr. 19, 2016 (TW) .............................. 105112159 A

(51) Int. Cl.
*H01L 27/32* (2006.01)
*H01L 51/52* (2006.01)

(52) U.S. Cl.
CPC ...... *H01L 27/3276* (2013.01); *H01L 51/5203* (2013.01)

(58) Field of Classification Search
CPC .................... H01L 27/3276; H01L 51/5203
See application file for complete search history.

(56) References Cited

U.S. PATENT DOCUMENTS

| 7,564,183 | B2* | 7/2009 | Luo ..................... | H01L 27/3223 |
| | | | | 313/501 |
| 2003/0143491 | A1* | 7/2003 | Lu ......................... | G03F 7/3042 |
| | | | | 430/315 |
| 2006/0273711 | A1* | 12/2006 | Luo ..................... | H01L 27/3223 |
| | | | | 313/500 |
| 2011/0217524 | A1* | 9/2011 | Kim ...................... | B32B 37/14 |
| | | | | 428/201 |
| 2013/0127926 | A1* | 5/2013 | Lewis .................... | G09G 5/00 |
| | | | | 345/690 |
| 2014/0327649 | A1* | 11/2014 | Lee ........................ | G06F 3/044 |
| | | | | 345/174 |
| 2017/0102797 | A1* | 4/2017 | Cok ...................... | G06F 3/0412 |
| 2017/0185193 | A1* | 6/2017 | Kim ...................... | G06F 3/0412 |
| 2017/0255324 | A1* | 9/2017 | Oka ....................... | G06F 3/0412 |
| 2017/0271566 | A1* | 9/2017 | Lee ........................ | H01L 27/156 |

* cited by examiner

*Primary Examiner* — Douglas Menz
(74) *Attorney, Agent, or Firm* — Maschoff Brennan

(57) ABSTRACT

A display panel includes a substrate, a plurality of first electrode series, a plurality of first electrode series and a plurality of conducting wires. The substrate is divided into a first display area and a second display area. The first display area and the second display area are respectively divided into light emitting zones and interval zones. The first electrode series are disposed in the first display area and the second display area. The second electrode series are disposed in the first display area and the second display area. Each first electrode series extends along a first direction. Each second electrode series extends along a second direction. The connection portion of each first electrode series extends into the interval zone of the first display area. The conducting wires are respectively coupled to the second electrode series in the first display area.

8 Claims, 2 Drawing Sheets

DISPLAY PANEL

CROSS-REFERENCE TO RELATED APPLICATIONS

This non-provisional application claims priority under 35 U.S.C. § 119(a) on U.S. Patent Application No(s). 105112159 filed in Taiwan R.O.C. on Apr. 19, 2016, the entire contents of which are hereby incorporated by reference.

BACKGROUND

Technical Field

This disclosure relates to a display panel, and more particularly to a display panel using organic light emitting diodes (OLED) to emit light.

Related Art

Nowadays, many kinds of display panels are developed. Among these display panels, a light emitting diode display panel uses a number of organic light emitting diodes (OLED) to display images. The OLEDs recombine the electrodes and the holes, generated by a current, to generate light. With many advantages, such as an outstanding ability of color reproduction and a reducible thickness, the OLED display panel is extensively used in lots of products. For example, the OLED display panel is applied to a personal digital assistant (PDA), a MP3 player, a mobile phone, and even a smart-watch.

The display panel is generally collated with a driver integrated circuit (IC) for emitting light so that the display panel displays a desired image. Generally speaking, the resolution of the display panel is matched to the resolution of the corresponding driver IC. For example, if the resolution of the display panel is 128×128 pixels, the display panel is collated with the driver IC with 128×128 resolution. In contrast, the display panel with 64×256 resolution cannot be used if it is collated with the driver IC with 128×128. In other words, if the manufacturer produces multiple display panel with different sizes or different resolutions, the extra production costs for redesigning and producing the driver IC become a burden for the manufacturer.

SUMMARY

This disclosure provides a display panel including a substrate, a plurality of first electrode series, a plurality of second electrode series, and a plurality of conducting wires. The substrate is divided into a first display area and a second display area. The first display area and the second display area are respectively divided into light emitting zones and interval zones. Each of the light emitting zones is respectively surrounded by the interval zones. The first electrode series are disposed in the first display area and the second display area respectively. Each of the first electrode series extends along a first direction and has a connecting portion. The connecting portions of the first electrode series in the second display area respectively extend in the interval zones in the first display area. Each first electrode series is coupled to the control module via the connecting portion. The second electrode series are disposed in the first display area and the second display area respectively. Each of the second electrode series extends along the second direction. Each of the conducting wires is respectively coupled to one of second electrode series in the first display area one of second electrode series in the second display area.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
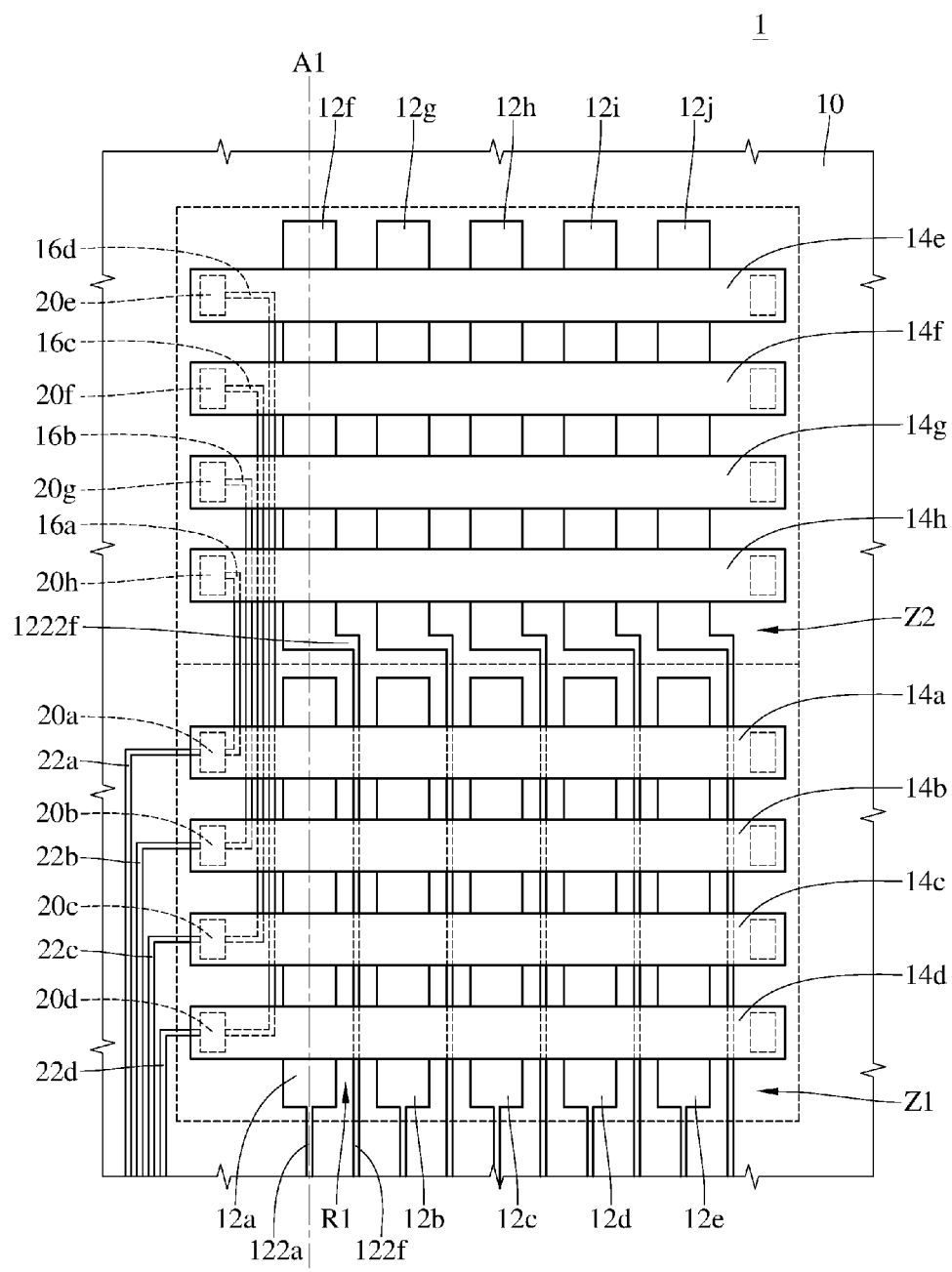
FIG. 1 is a schematic diagram of a layout of part of components of a display panel in an embodiment of this disclosure.

Please refer to FIG. 1 is a schematic diagram of a layout of part of components of a display panel in an embodiment of this disclosure. The display panel 1 includes a substrate 10, a plurality of first electrode series, a plurality of second electrode series and a plurality of conducting wires. To describe simply and clearly, the figures just show and describe part repeated components, and the relative position and the efficiency of another components can be inferred from the statement about similar components. Moreover, a certain number of components are referred to for explanation hereafter, but person having ordinary skill in the art is able to comprehend that this disclosure does not intend to limit the amount of any component.

A first display area Z1 and a second display area Z2 are defined on a surface of the substrate 10 where the electrode series disposed. The first display area Z1 is divided into a plurality of light emitting zones and a plurality of interval zones. The second display area Z2 is also divided into a plurality of light emitting zones and a plurality of interval zones. Each light emitting zone of the first display area Z1 is surrounded by part of the plurality of interval zones of the first display area Z1, and each light emitting zone of the second display area Z2 is surrounded by part of the plurality of interval zones of the second display area Z2. Person having ordinary skill in the art is able to comprehend the definition of the light emitting zone by reading this specification, so the definition of light emitting zone is not detailed described herein.

The first electrode series 12a-12e are disposed in the first display area Z1, and the first electrode series 12f-12j are disposed in the second display area Z2. The first electrode series 12a-12j extend along the y-axis and each of the first electrode series 12a-12j respectively include a connecting portion. Referred to as an example, the first electrode series 12a and the first electrode series 12f respectively include the connecting portion 122a and the connecting portion 122f. The first electrode series 12a and the first electrode series 12f are coupled to a control module respectively via the connecting portion 122a and the connecting portion 122f (not shown in the figure). The control module is, for example, a driver integrated circuit. The display panel 1 selectively emits light according to an instruction of the control module. This disclosure does not intend to limit the type of the control module. The connecting portion 122a extends along the y-axis. The connecting portion 122f approximately extends along the y-axis, and extends into the interval zone R1 of the first display area Z1. More specifically, in this embodiment, the first electrode series 12f is on an extension axis A1 of the first electrode series 12a. In other words, the first electrode series 12f is aligned with first electrode series 12a on the y-axis. Besides, the connecting portion 122f has a bent section 1222f in practice, and is coupled to the main body of the first electrode series 12f via the bent section 1222f. As a result, the connecting portion 122f is capable of being coupled to the main body of the first electrode series 12f and extending into the interval zone R1 of the first display area Z1 at the same time. In practice, each first electrode series and its connecting portion may be made up of the same material. One method is depositing a patterned conducting layer on the substrate 10 to form each of the first electrode series via the same photomask. For example, the material of the first electrode series is indium tin oxide (ITO), indium gallium zinc oxide (IGZO), or indium tin zinc oxide (ITZO). However, this disclosure does not intend to limit the material of the first electrode. In an embodiment, the first electrode series is used as an anode.

The second electrode series 14a-14d are disposed in the first display area Z1, and the second electrode series 14e-14h are disposed in the second display area Z2. The second electrode series 14a-14h extends along the x-axis, so viewed from the z-axis, the second electrode series 14a-14d crisscross with the first electrode series 12a-12e and the second electrode series 14e-14h crisscross with the first electrode series 12f-12j. Because the first electrode series 12a-12j and the second electrode series 14a-14h are respectively at different layers, the second electrode series 14a-14d do not directly contact with the first electrode series 12a-12e, and the second electrode series 14e-14h do not directly contact with first electrode series 12f-12j. In an embodiment, the first electrode series 12a and the second electrode series 14a are referred to as an example. The organic light emitting material is disposed on the intersection of the first electrode series 12a and the second electrode series 14a. In other words, the organic light emitting material is disposed between the first electrode series 12a and the second electrode series 14a. When an enough voltage is supplied to the first electrode series 12a and the second electrode series 14a, the organic light emitting material emits light. The similar structure also exists between each aforementioned first electrode series and each second electrode series. The aforementioned light emitting zones are defined as, for example, the intersections of the first electrode series and the second electrode series. This disclosure does not intend to limit the exact area of each the light emitting zone. Besides, the second electrode series is made of the conductive material. In an embodiment, the second electrode series is used as a cathode, but is not limited by it. The space relation between the first electrode series and the second electrode series is not limited by the figures in this disclosure.

In the following statement, the conducting wire 16a is referred to as an example to describe the conducting wires 16a-16d. One end of the conducting wire 16a is coupled to the second electrode series 14a in the first display area Z1, and the other end of the conducting wire 16a is coupled to the second electrode series 14h in the second display area Z2. In other words, the second electrode series 14a is coupled to the second electrode series 14h via the conducting wire 16a. In an embodiment, one pad is disposed on one end of each of the second electrode series 14a-14h. Part of the pads respectively corresponds to the second electrode series 14a-14d in the first display area Z1 and part of the pads respectively corresponds to the second electrode series 14e-14h in the second display area Z2. To state more simply, the pads are defined as first pads 20a-20d and second pads 20e-20h. The conducting wire 16a is coupled to the first pad 20a and the second pad 20h. Similarly, the conducting wires 16a-16d are coupled to the second electrode series 14a-14d via the first pad 20a-20d respectively, and are coupled to the second electrode series 14e-14h via the second pad 20e-20h respectively. In another embodiment, each two end of each of the second electrode series respectively has a pad, and the conducting wires are disposed on both sides of the display panel. Both ends of the second electrode series 14a-14d are respectively coupled to both ends of the second electrode series 14e-14h, by a layout similar as the one in FIG. 1, to prevent a brightness inhomogeneity. However, the above statement is just referred to as an example, and this disclosure does not intend to limit the layout of the second electrode series.

In an embodiment as shown in FIG. 1, the display panel 1 further includes leading wires 22a-22d. The second electrode series 14a-14d are coupled to the control module respectively via the leading wires 22a-22d. This disclosure does not intend to limit that the control module coupled to the second electrode series 14a-14d and the control module coupled to the first electrode series 12a-12j are same or different. In an embodiment, the leading wires 22a-22d are made of a patterned conducting layer on the display panel 1 via a photomask, and the conducting wire 16a-16d are made of a patterned conducting layer on the display panel 1 via the same photomask. Therefore, the material and the manufacturing process of the leading wires 22a-22d are same as the material and the manufacturing process of the conducting wire 16a-16d. In another embodiment, the leading wires 22a-22d and the conducting wires 16a-16d may be separated. That is, the material and the manufacturing process of the leading wires 22a-22d may be different from the material and the manufacturing process of the conducting wire 16a-16d. The leading wires 22a-22d and the conducting wire 16a-16d are made of a conductive material.

In view of the above structure, although the first electrode series 12a-e and the first electrode series 12f-12j are respectively disposed in the first display area Z1 and the second display area Z2, the first electrode series 12f-12j in the second display area Z2 are capable of being coupled to the corresponding control module via the connecting portions. In the other hand, the display panel 1 may be controlled by another control module rather than the originally matched one by making the second electrode series 14a-14d in the first display area Z1 respectively coupled to the second electrode series 14e-14h in the second display area Z2 via the conducting wire 16a-16d. For example, if the control module, which provides control signals to the first electrode series and the second electrode series, supports a 128×128 resolution, the control module should be capable of controlling a display panel with the 128×128 resolution. However, when a display panel with a 64×256 resolution is constructed with the structure as shown in FIG. 1, the display panel with the 64×256 resolution is applied to the aforementioned control module, which supports the 128×128 resolution. Besides, the control module is capable of remaining the original control duty without any adjustment. In addition, in terms of power supplying, because the second electrode series 14a-14d in the first display area Z1 are respectively coupled to the second electrode series 14e-14h in the second display area Z2 via the conducting wire 16a-16d, the resolution of display panels can increase as driving the second electrode series. Person having ordinary skills in the art is able to deduce the related control details after reading this specification, so the details are not described herein.

From another point of view, the control module includes first outputting ports and second outputting ports wherein the first outputting ports are coupled to the first electrode series and the second outputting ports are coupled to the second electrode series via the conducting wires. The control module with the 128×128 resolution includes at least 128 of the first outputting ports and 128 of the second outputting ports. In this embodiment, in total, there are 128 of the first electrode series, 256 of the second electrode series, and 128 of the conducting wires in the first display area Z1 and in the second display area Z2. Therefore, with respect to the amount of the pads, the display panel with the 64×256 resolution is indeed applied to the control module, which supports 128×128 resolution, when the layout in FIG. 1 is used in the display panel. If the amount of each component is parameterized, for example, the amount of the first electrode series is defined as M, the amount of the conducting wires is defined as N, the amount of the first outputting ports of the control module, is defined as P, and the amount of the second outputting ports of the control module, is defined as Q, P is not less than M and Q is not less than N. In addition, M, N, P and Q all are positive integers. In a more specific embodiment, P is defined as an integer multiple of M, and Q is defined as an integer multiple of N. In other words, by divided into more display areas and with a wiring layout similar to the wiring layout in FIG. 1, the display panel 1 is applied to the control module which supports a fixed resolution, even though the display panel 1 has different resolution.

Compared to the embodiment as shown in FIG. 1, in another embodiment, the first electrode series 12f is referred to for explanation. The interval zone R1 of the first display area Z1 is located on the extension axis A1 of the first electrode series 12f. In other words, the extension axis the of the first electrode series in the second display area Z2 passes through the longitudinal interval zone R1 of the first display area Z1. In this embodiment, the connecting portions, without any bent section, of the first electrode series in the second display area Z2 extend along the y-axis.

Figure 2:
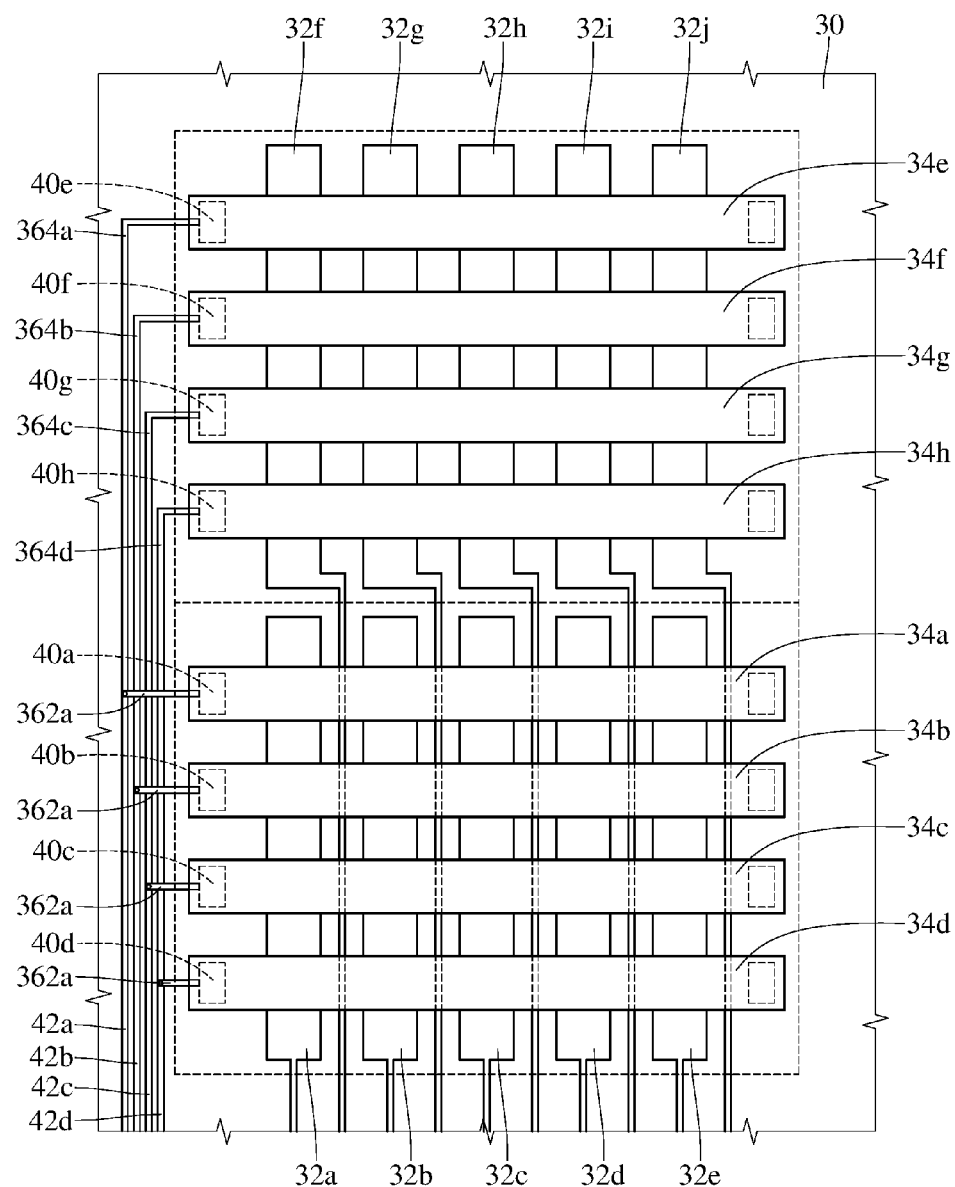
FIG. 2 is a schematic diagram of a layout of part of components of a display panel in another embodiment of this disclosure.

Please refer to FIG. 2. FIG. 2 is a schematic diagram of a layout of part of components of a display panel in another embodiment of this disclosure. Compared to the display panel 1 in FIG. 1, the display panel 3 in FIG. 2 includes a insulation layer (not shown in the figure), and the conducting wires are divided into a first wiring part and a second wiring part. The first wiring part is on the insulation layer and is coupled to one of the first pads, and the second wiring part is under the insulation layer and is coupled to one of the second pads. For example, the conducting wire 36a is divided into first wiring part 362a and the second wiring part 364a. The first wiring part 362a is on the insulation layer and is coupled to the first pad 40a, and the second wiring part 364a is under the insulation layer and is coupled to the second pad 40h. In other words, part of the conducting wire 36a passes upward through the insulation layer and is coupled to the first pad 40a on the insulation layer. By the wiring method mentioned above, the border width is reduced effectively under the situation that the amount of the conducting wires increases due to a high resolution.

In view of the above statement, this disclosure provides a display panel, which includes a first display area and a second display area. A plurality of first electrode series and a plurality of second electrode series are disposed in both first display area and second display area. Each of the second electrode series in the first display area is respectively coupled to one of the second electrode series in the second display area via one of the conducting wires. Therefore, although the size or the resolution of the display panel is not matched to the resolution which is supported by a driver integrated circuit, the display panel provided in one or more embodiments of this disclosure is still applied to the driver integrated circuit so that when a manufacturer produces multiple display panels with different resolutions, or uses multiple display panels with different resolutions, the manufacturer does not need to use an extra driver integrated circuit, and a production cost is substantially reduced. In sum, the display panel provided in one or more embodiments of this disclosure is very practical.

What is claimed is:

1. A display panel, comprising:
   a substrate divided into a first display area and a second display area, wherein the first display area and the second display area are respectively divided into a plurality of light emitting zones and a plurality of interval zones, and each of the plurality of light emitting zones is surrounded by part of the plurality of interval zones;
   a plurality of first electrode series respectively disposed in the first display area and the second display area, wherein each of the plurality of first electrode series extends along a first direction and comprises a connecting portion, the connecting portion of each of the plurality of first electrode series in the second display area extends to one of the plurality of interval zones in the first display area, and each of the plurality of first electrode series is coupled to a control module via the connecting portion;
   a plurality of second electrode series respectively disposed in the first display area and the second display area, wherein each of the plurality of second electrode series extends along a second direction; and
   a plurality of conducting wires wherein each of the plurality of conducting wires is respectively coupled to one of the plurality of second electrode series in the first display area and one of the plurality of second electrode series in the second display area.

2. The display panel according to claim 1, further comprising a insulation layer wherein each of the plurality of conducting wires is divided into a first wiring part and a second wiring part, the first wiring part is disposed on the insulation layer and coupled to one of a plurality of first pads, and the second wiring part is disposed under the insulation layer and coupled to one of a plurality of second pads.

3. The display panel according to claim 1, wherein amount of the plurality of first electrode series is M, amount of the plurality of conducting wires is N, the control module comprises P of first outputting ports and Q of second outputting ports, each of the plurality of first electrode series is respectively coupled to one of the first outputting ports, each of the plurality of conducting wires is respectively coupled to one of the second outputting ports, P is not less than M, Q is not less than N, and M, N, P and Q are positive integer.

4. The display panel according to claim 3, wherein P is an integer multiple of M, and Q is an integer multiple of N.

5. The display panel according to claim 1, wherein each of the plurality of first electrode series in the first display area are respectively disposed on an extension axis of one of the plurality of first electrode series in the second display area.

6. The display panel according to claim 5, wherein the connecting portion of one of the plurality of first electrode series in the second display area has a bent section coupled to a main body of the one of the plurality of first electrode series via the connecting portion.

7. The display panel according to claim 1, wherein each of the plurality of interval zones in the first display area are respectively disposed on an extension axis of one of the plurality of second electrode series in the second display area.

8. The display panel according to claim 7, wherein the connecting portion of one of the plurality of first electrode series in the second area extends along the first direction.

* * * * *